United States Patent [19]
Goetting

[11] Patent Number: 5,764,534
[45] Date of Patent: Jun. 9, 1998

[54] METHOD FOR PROVIDING PLACEMENT INFORMATION DURING DESIGN ENTRY

[75] Inventor: F. Erich Goetting, Cupertino, Calif.

[73] Assignee: Xilinx, Inc., San Jose, Calif.

[21] Appl. No.: 684,916

[22] Filed: Jul. 22, 1996

Related U.S. Application Data

[63] Continuation of Ser. No. 324,031, Oct. 13, 1994, abandoned.

[51] Int. Cl.$^6$ ........................................ G06F 17/50
[52] U.S. Cl. ................................... 364/491; 364/490
[58] Field of Search ........................ 364/488, 489, 364/490, 491

[56] References Cited

U.S. PATENT DOCUMENTS

| | | | |
|---|---|---|---|
| 4,377,849 | 3/1983 | Finger et al. | 364/491 |
| 4,613,940 | 9/1986 | Shenton et al. | 364/490 |
| 4,651,284 | 3/1987 | Watanabe et al. | 364/491 |
| 5,111,413 | 5/1992 | Lazansky et al. | 364/578 |
| 5,197,016 | 3/1993 | Sugimoto et al. | 364/490 |
| 5,222,029 | 6/1993 | Hooper et al. | 364/489 |
| 5,225,991 | 7/1993 | Dougherty et al. | 364/491 |
| 5,239,465 | 8/1993 | Hattori et al. | 364/419.19 |
| 5,351,197 | 9/1994 | Upton et al. | 364/491 |
| 5,369,595 | 11/1994 | Gould et al. | 364/490 |
| 5,377,123 | 12/1994 | Hyman | 364/489 |
| 5,452,226 | 9/1995 | Hooper et al. | 364/489 |
| 5,499,192 | 3/1996 | Knapp et al. | 364/489 |

*Primary Examiner*—Kevin J. Teska
*Assistant Examiner*—Thai Phan
*Attorney, Agent, or Firm*—David A. Klein; Adam H. Tachner; Jeanette S. Harms

[57] ABSTRACT

A method of providing placement information during design entry is described which includes the steps of indicating an element type in an instance, identifying a port list for a specific element in the instance, and providing embedded placement information regarding the specific element in the instance. In one embodiment, the embedded placement information includes a cell location, whereas in another embodiment, the embedded placement information includes a block location. This method eliminates the need for a separate file with placement information, thereby improving user efficiency and significantly minimizing user error.

18 Claims, 3 Drawing Sheets

METHOD FOR PROVIDING PLACEMENT INFORMATION DURING DESIGN ENTRY

This application is a continuation of application Ser. No. 08/324,031, filed Oct. 13, 1994, abandoned now.

BACKGROUND OF THE INVENTION

1. Field of the Invention

The present invention relates to logic design and in particular to a method for including placement information during design entry using a hardware description language.

2. Description of the Related Art

Schematic capture programs are well known in the art. In one conventional schematic capture program, the user chooses a primitive from a listing of predefined primitives and then interconnects those selected, predefined primitives to build functional modules. Typically, the schematic capture program automatically generates names for each gate level primitive on screen. These names are referred to as "instance" names. The connections to the primitive are referred to as "ports" and are also named by the schematic capture program.

FIG. 1 shows an illustrative functional module 100 including a plurality of gate level primitives. Specifically, functional module 100 includes two AND gates with instance names of I1 and I2, and an OR gate with an instance name of I3. The connections to the primitives have port names of N1–N7. To designate the location of the instance on a chip, the user creates a separate data file by defining a location of a particular instance. Typically, this attachment process requires the user to type in a location command, such as "location(I1)=X11Y6" (for instance I1 of FIG. 1). After the user enters the logic design, an implementation program automatically maps the logic into the resources of the specific device. If the user provided no placement information during schematic capture, the implementation program determines the placement of the logic primitives. If the user provided placement information, the implementation program reads the schematic and maps the logic according to the location commands in the separate data file.

In another increasing popular design entry method, the user creates code in a hardware description language. Hardware description language permits the user to write a structural description of a logic primitive (using an instance) or a higher level behavioral description which indicates a Boolean algebra equation of a logic function. Table 1 below lists three instances which describe the code equivalent of module 100 (FIG. 1) and an illustrative associated behavioral description (wherein port N1 receives signal A, port N2 receives signal B, port N3 receives signal C, and port N4 receives signal D). Note that each instance in Table 1 identifies a particular logic primitive, as well as its associated instance and port names.

TABLE 1

| AND2 I1(N5, N1, N2) |
| AND2 I2(N6, N3, N4) |
| OR2 I3(N7, N5, N6) |
| ((A*B) + (C*D)) |

Note that conventional structural descriptions include rules for primitives in which the sequence of the port names is defined. In the structural description shown in Table 1, the output port is, by definition, the first identifier in the parenthetical of the instance. If the user wants to place an instance at a particular location on chip, the user must access the implementation program and create a separate constraint file to indicate the designated location. Behavioral descriptions, which lack instance names, do not permit the user to provide associated placement information, even in a separate constraint file.

Thus, irrespective of whether the user enters a logic design using schematic capture or hardware description language, inherent inefficiencies occur and the possibility of user errors increases if a user attempts to include placement information for that logic design. Therefore, a need arises for a method of providing placement information regarding elements in a logic design without creating a separate file.

SUMMARY OF THE INVENTION

In accordance with the present invention, an instance name includes embedded placement information. Specifically, an instance includes a designation of an element type, a port list indicating the electrical connections associated with a predetermined element, and an instance name including embedded placement information regarding the predetermined element. In one embodiment, the placement information includes a cell location defined via Cartesian coordinates. In another embodiment, the placement information includes a block location defined via a plurality of Cartesian coordinates.

The present invention eliminates the prior art need for a separate file with placement information, thereby dramatically improving efficiency and minimizing user error.

DETAILED DESCRIPTION OF THE DRAWINGS

In accordance with the present invention, an instance name includes embedded placement information which subsequently triggers an implementation program to automatically place a user-designated primitive in a predetermined location on a chip. In this manner, the present invention eliminates the separate file of the prior art.

Figure 1:
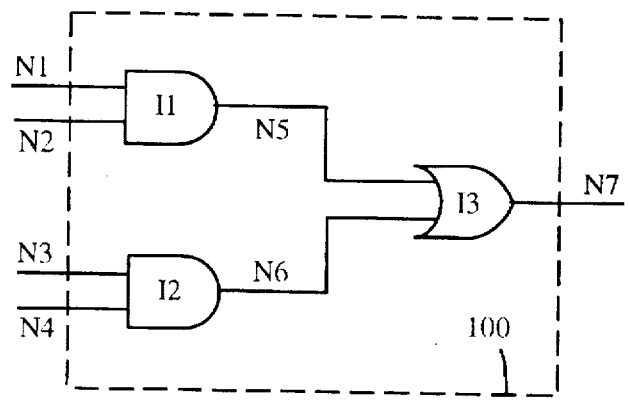
FIG. 1 shows an illustrative schematic capture screen in which each primitive is provided an instance name and associated net names.
Figure 2A:
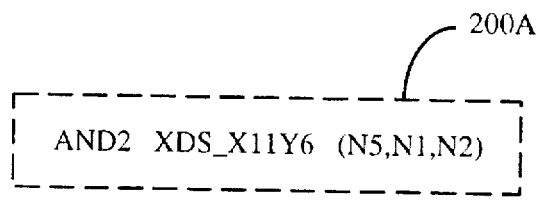
FIG. 2A illustrates an instance in accordance with the present invention.
Figure 2B:
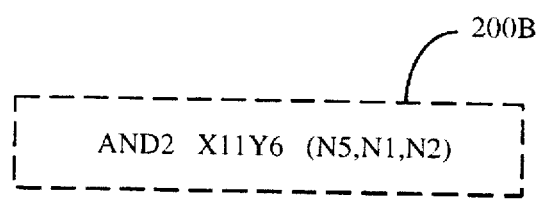
FIG. 2B shows another instance in accordance with the present invention.

FIG. 2A illustrates an instance 200A in accordance with the present invention which includes a library element descriptor, a port listing associated with a specific library element, and an instance name including embedded placement information. In FIG. 2A, the library element descriptor is "AND2" (i.e. an AND gate having two input terminals), the port listing for a specific AND2 element is "(N5,N1,N2)", and the instance name is "XDS_X11Y6", wherein XDS™ is a trademark for an implementation program of Xilinx, Inc., located at 2100 Logic Drive, San Jose, Calif. 95124, and X11Y6 indicates the embedded placement information (explained in detail in reference to FIG. 4). In another embodiment of the present invention shown in FIG.

2B, an instance 200B includes an instance name comprising only the designation "X11Y6".

Figure 4:
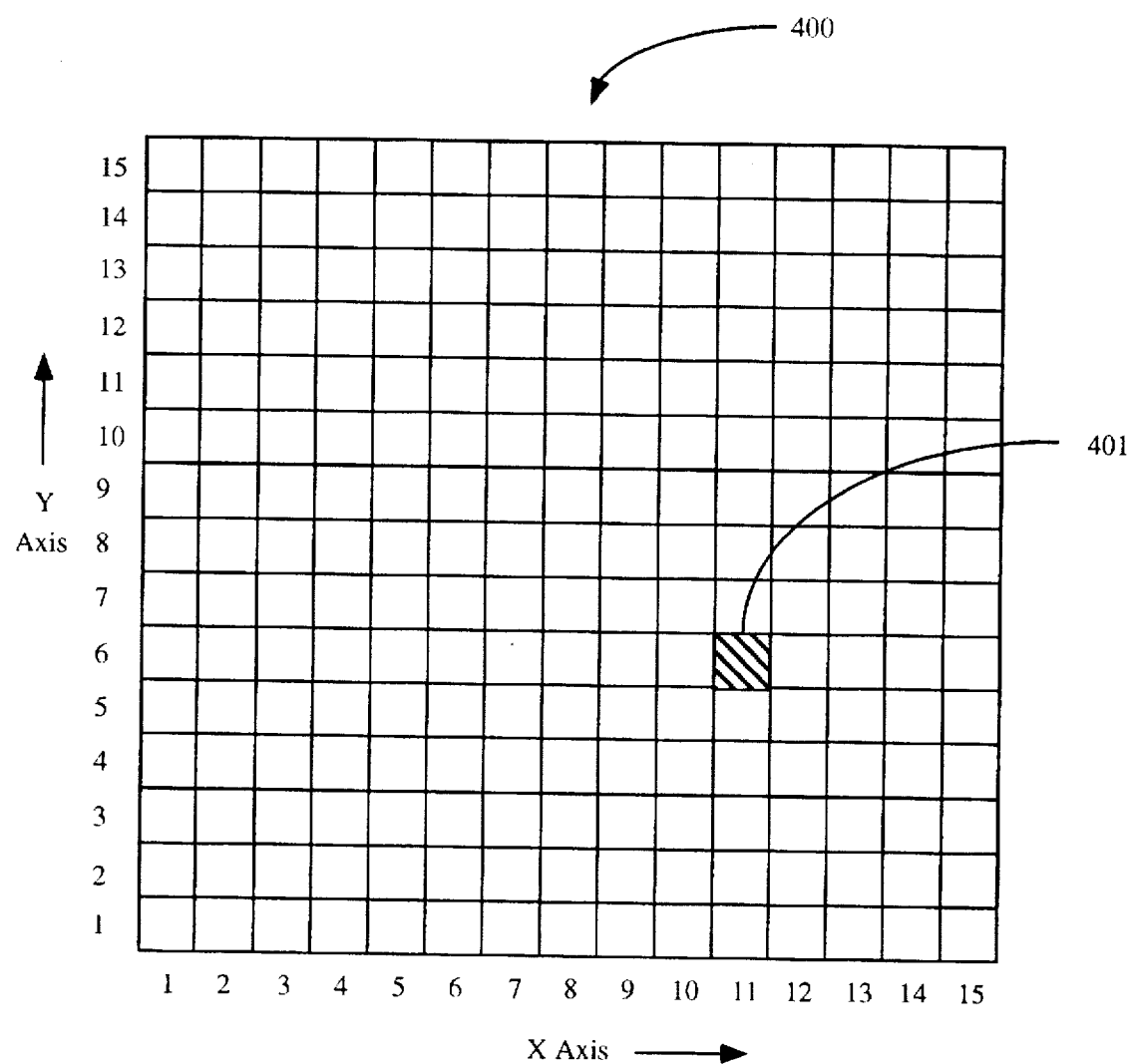
FIG. 4 shows a Cartesian coordinate system in which the placement of one cell is indicated.

In accordance with either above-described embodiment of the present invention, the instance name causes an implementation program (in this case, the XDS™ program) to physically place the user-designated library element (the AND gate, for example) at a particular location in a grid of cells. Typically, a Cartesian coordinate system is used to indicate placement information of the logic primitive (i.e. the AND gate) on a cell of a grid. In one embodiment, a field programmable gate array (FPGA) is divided into a 48×48 cell grid. However, the number of cells in the grid varies depending on FPGA size. FIG. 4 shows the location of instance 200A (indicated by cell 401) in an FPGA 400 which is divided into a 15×15 grid.

Figure 3:
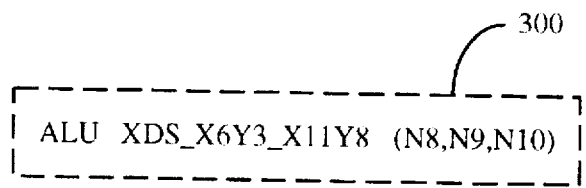
FIG. 3 illustrates yet another instance in accordance with the present invention.
Figure 5:
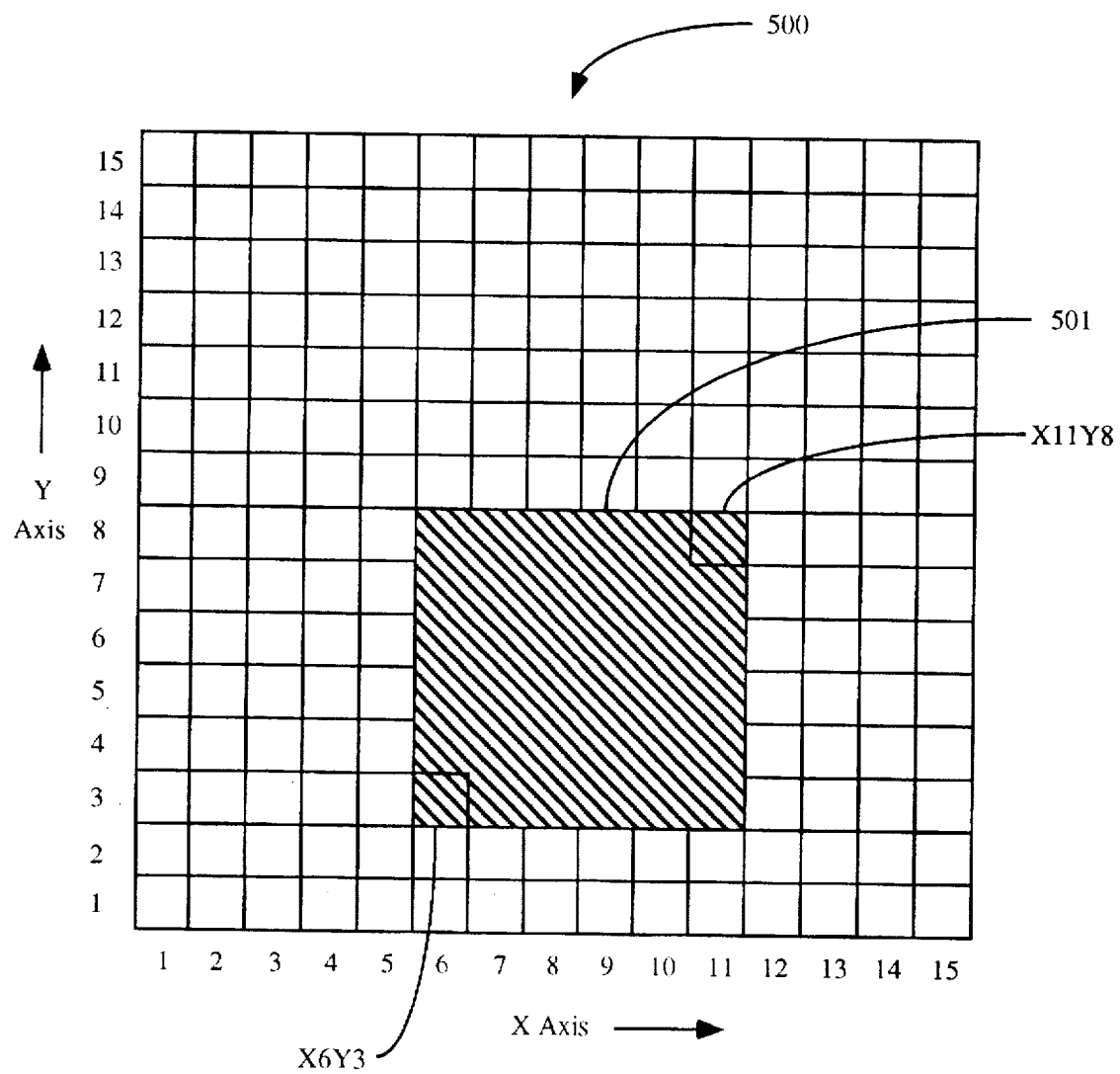
FIG. 5 shows a Cartesian coordinate system in which the placement of a block of cells is indicated.

In another embodiment of the present invention shown in FIG. 5, a larger high level element, such as an arithmetic logic unit (ALU), is positioned in block 501. Because the ALU takes up multiple cells, the corresponding instance is modified. Specifically, as shown in FIG. 3, an instance 300 includes the element designator, the port list, and the instance name, wherein the embedded placement information included in the instance name provides the locations of two corner cells of the block. In this example, block 501 (FIG. 5) is defined by X6Y3 and X11Y8, i.e. the Cartesian coordinates of the lower left corner cell and the upper right corner cell of block 501.

In accordance with the present invention, a user is able to indicate any number of blocks on FPGA chip 500, thereby allowing the user to segment the design into its various functional components. Note that prior art implementation programs which are completely automated generally do not provide this segmentation. Thus, the present invention significantly improves performance in comparison with those prior art programs.

The embedded placement information in the design entry process provides the following advantages.

(1) The present invention eliminates the separate files of placement information required by prior art logic design systems, thereby dramatically improving user efficiency. Specifically, only one entry is needed to both identify and place an element or group of elements on a chip. Thus, the present invention significantly reduces design entry time.

(2) Furthermore, the present invention eliminates the need for the user to compare two files, i.e. all information is Consolidated in one entry. In this manner, the present invention also significantly minimizes user error.

(3) Because the user writes in pure hardware description language (i.e. well known languages, such as Verilog or VHDL), which is typically a much faster method of design entry than using a schematic capture system, the present invention allows the user to reduce the time needed to finish design entry.

(4) Although automated tools provide ease of use, the user may have a better grasp of functional divisions in the logic design. The present invention allows the user to control all or portions of the implementation process (i.e. provide placement information regarding a primitive or a group of primitives) in a single step, thereby improving the efficiency of the design.

The embodiments described in detail above are illustrative only and not limiting. Other embodiments of the present invention will be apparent to those skilled in the art. The present invention is set forth in the appended claims.

I claim:

1. A method of schematically generating a logic circuit design adapted for fabrication on a circuit platform comprising the steps of:

a) defining a position reference system for said circuit platform;

b) defining a plurality of predetermined logic circuit elements, each of said predetermined logic circuit elements having at least one input port and at least one output port; and, c) executing a hardware description language program for interconnecting selected ones of said predetermined logic circuit elements, said execution including steps for processing a plurality of instances, said processing steps incorporating in at least one of said instances the steps of:

(1) providing an element designation portion for indicating a selected one of said predetermined logic circuit elements corresponding to said instance;

(2) simultaneously providing with said element designation portion a port list designation portion for identifying a plurality of predetermined circuit node designations corresponding respectively to said ports of said selected one of said predetermined logic circuit elements; and, (3) further simultaneously providing with said element designation portion an instance designation portion for both uniquely identifying said instance and indicating a placement position of said selected logic circuit element on said circuit platform, said instance designation portion having embedded therein placement position information relative to said position reference system for said selected logic circuit element.

2. The method of schematically generating a logic circuit design as recited in claim 1 wherein said position reference system is a coordinate reference system delineating an array of discrete cells.

3. The method of schematically generating a logic circuit design as recited in claim 2 wherein said instance designation portion of each said instance in said program includes the position coordinates in said coordinate reference system of a selected one of said cells.

4. The method of schematically generating a logic circuit design as recited in claim 3 wherein said coordinate reference system is a Cartesian coordinate system.

5. The method of schematically generating a logic circuit design as recited in claim 2 wherein said instance designation portion of each said instance in said program includes position coordinates in said coordinate reference system delineating a block containing a selected plurality of said cells.

6. The method of schematically generating a logic circuit design as recited in claim 5 wherein said coordinate reference system is a Cartesian coordinate system.

7. A method of controlling computer processing means to schematically generate a logic circuit design adapted for fabrication on a circuit platform comprising the steps of:

a) defining a position reference system for said circuit platform;

b) defining a plurality of predetermined logic circuit elements selectively interconnectable to form said logic circuit design, each of said predetermined logic circuit elements having at least one input port and at least one output port; and, c) transmitting to said computer processing means a plurality of hardware description language commands, said commands including steps for processing a plurality of instances, said processing steps incorporating in at least one of said instances the steps of:

(1) providing an element designation portion for indicating a selected one of said predetermined circuit elements corresponding to said instance;

(2) simultaneously providing with said element designation portion a port list designation portion for identifying a plurality of predetermined circuit node designations corresponding respectively to said ports of said selected one of said predetermined logic circuit elements; and, (3) further simultaneously providing with said element designation portion a placement indication portion for indicating a placement position of said selected logic circuit element on said circuit platform, said placement indication portion having embedded therein placement position information relative to said position reference system for said selected logic circuit element.

8. The method of schematically generating a logic circuit design as recited in claim 7 wherein said position reference system is a coordinate reference system delineating an array of discrete cells.

9. The method of schematically generating a logic circuit design as recited in claim 8 wherein said placement indication portion of each said instance in said commands includes the position coordinates in said coordinate reference system of a selected one of said cells.

10. The method of schematically generating a logic circuit design as recited in claim 9 wherein said coordinate reference system is a Cartesian coordinate system.

11. The method of schematically generating a logic circuit design as recited in claim 8 wherein said placement indication portion of each said instance in said commands includes position coordinates in said coordinate reference system delineating a block containing a selected plurality of said cells.

12. The method of schematically generating a logic circuit design as recited in claim 11 wherein said coordinate reference system is a Cartesian coordinate system.

13. A method of transmitting logic circuit element placement information to computer processing means executing a plurality of hardware description language commands to schematically generate a logic circuit design adapted for fabrication on a circuit platform comprising the steps of:

(a) defining a position reference system for said circuit platform; and, (b) processing a plurality of instances, said processing of each of said instances including the steps of:

(1) providing an element designation portion for indicating a selected one of a plurality of predetermined logic circuit elements to be interconnected in said logic circuit design, said logic circuit elements each having input and output ports;

(2) simultaneously providing with said element designation portion a port list designation portion for identifying a plurality of predetermined circuit node designations corresponding respectively to said ports of said selected one of said predetermined logic circuit elements; and, (3) further simultaneously providing with said element designation portion an instance designation portion for both uniquely identifying said instance and indicating a placement position of said selected logic circuit element on said circuit platform, said instance designation portion having embedded therein placement position information relative to said position reference system for said selected logic circuit element.

14. The method of schematically generating a logic circuit design as recited in claim 13 wherein said position reference system is a coordinate reference system delineating an array of discrete cells.

15. The method of schematically generating a logic circuit design as recited in claim 14 wherein said instance designation portion of each said instance in said commands includes the position coordinates in said coordinate reference system of a selected one of said cells.

16. The method of schematically generating a logic circuit design as recited in claim 15 wherein said coordinate reference system is a Cartesian coordinate system.

17. The method of schematically generating a logic circuit design as recited in claim 14 wherein said instance designation portion of each said instance in said commands includes position coordinates in said coordinate reference system delineating a block containing a selected plurality of said cells.

18. The method of schematically generating a logic circuit design as recited in claim 17 wherein said coordinate reference system is a Cartesian coordinate system.

* * * * *